United States Patent
Gerhardt et al.

(10) Patent No.: US 7,348,233 B1
(45) Date of Patent: Mar. 25, 2008

(54) METHODS FOR FABRICATING A CMOS DEVICE INCLUDING SILICIDE CONTACTS

(75) Inventors: Martin Gerhardt, Dresden (DE); Igor Peidous, Fishkill, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 320 days.

(21) Appl. No.: 11/207,265

(22) Filed: Aug. 19, 2005

(51) Int. Cl.
*H01L 21/8238* (2006.01)

(52) U.S. Cl. .................. 438/199; 438/303; 438/306; 438/682; 257/384; 257/E21.634; 257/E21.619

(58) Field of Classification Search ........ 257/E21.634, 257/E21.619; 438/527, 303, 306
See application file for complete search history.

(56) References Cited

U.S. PATENT DOCUMENTS

| | | | |
|---|---|---|---|
| 6,214,673 B1 * | 4/2001 | Grebs et al. | 438/274 |
| 6,853,048 B1 * | 2/2005 | Wylie | 257/517 |
| 6,869,866 B1 * | 3/2005 | Chidambarrao et al. | 438/581 |
| 2002/0081827 A1 * | 6/2002 | Hamanaka | 438/592 |
| 2004/0056304 A1 * | 3/2004 | Ahmed et al. | 257/336 |

* cited by examiner

*Primary Examiner*—Thao X. Le
*Assistant Examiner*—Daniel M Luke
(74) *Attorney, Agent, or Firm*—Ingrassia Fisher & Lorenz, P.C.

(57) ABSTRACT

Methods are provided for fabricating a CMOS device having a silicon substrate including a first N-type region and a second P-type region. The method includes the steps of forming a first gate electrode overlying the first N-type region and a second gate electrode overlying the second P-type region. P-type source and drain regions are ion implanted into the first N-type region, and N-type source and drain regions are ion implanted into the second P-type region. First silicide regions, spaced apart from the first gate electrode by a first distance, are formed contacting the P-type source and drain regions, and second silicide regions, spaced apart from the second gate electrode by a second distance less than the first distance, are formed contacting the N-type source and drain regions.

16 Claims, 4 Drawing Sheets

METHODS FOR FABRICATING A CMOS DEVICE INCLUDING SILICIDE CONTACTS

TECHNICAL FIELD OF THE INVENTION

The present invention generally relates to methods for fabricating CMOS devices, and more particularly relates to methods for fabricating CMOS devices having silicide contacts to source and drain regions that enhance mobility of electrons in NMOS devices and minimize mobility degradation of holes in PMOS devices.

BACKGROUND OF THE INVENTION

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain regions between which a current can flow. A control voltage applied to the gate electrode controls the flow of current through a channel between the source and drain electrodes. Complementary MOS (CMOS) devices include a plurality of N-channel MOS (NMOS) transistors and a plurality of P-channel (PMOS) transistors.

The source and drain regions are spaced apart impurity doped regions formed in a silicon substrate on opposite sides of the gate electrode. Metal silicides are often used to electrically contact the source and drain regions and to lower their electrical resistance. The metal silicide is formed by depositing a thin layer of silicide forming metal onto the silicon region and then heating the metal to react with the underlying silicon. Most common metal silicides have a very high coefficient of thermal expansion in comparison to silicon. After the silicidation the device is cooled, and, because of the high coefficient of thermal expansion, the metal silicide contracts faster than the silicon in which the silicide is formed. The differential contraction upon cooling generates a longitudinal tensile stress outside the silicide area of the source and drain regions including in the channel of the MOS transistor.

MOS transistors, in contrast to bipolar transistor, are majority carrier devices. The gain of an MOS transistor, usually defined by the transconductance ($g_m$), is proportional to the mobility of the majority carriers in the transistor channel. The current carrying capability of an MOS transistor is proportional to the mobility of the majority carrier in the channel. The mobility of electrons, the majority carrier in an NMOS transistor, can be increased by applying a longitudinal tensile stress to the channel. The tensile stress caused by the differential contraction can thus improve the performance of an NMOS transistor. Unfortunately, such a tensile stress decreases the mobility of holes, the majority carrier in PMOS transistors, and hence can degrade the performance of a PMOS transistor if applied to the PMOS transistor channel.

Accordingly, it is desirable to provide methods for fabricating CMOS transistors that enhance the mobility of electrons in NMOS transistors and minimize mobility degradation of holes in PMOS transistors. In addition, it is desirable to provide methods for fabricating CMOS transistors that include metal silicide contacts to source and drain regions with optimized channel stress. Furthermore, other desirable features and characteristics of the present invention will become apparent from the subsequent detailed description and the appended claims, taken in conjunction with the accompanying drawings and the foregoing technical field and background.

BRIEF SUMMARY OF THE INVENTION

Methods are provided for fabricating a CMOS device having a silicon substrate including a first N-type region and a second P-type region. The method includes the steps of forming a first gate electrode overlying the first N-type region and a second gate electrode overlying the second P-type region. P-type source and drain regions are ion implanted into the first N-type region, and N-type source and drain regions are ion implanted into the second P-type region. First silicide regions, spaced apart from the first gate electrode by a first distance, are formed contacting the P-type source and drain regions, and second silicide regions, spaced apart from the second gate electrode by a second distance less than the first distance, are formed contacting the N-type source and drain regions.

BRIEF DESCRIPTION OF THE DRAWINGS

The present invention will hereinafter be described in conjunction with the following drawing figures, wherein like numerals denote like elements, and wherein FIGS. 1-12 schematically illustrate, in cross section, a CMOS device and methods for its fabrication in accordance with various embodiments of the invention.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-12 illustrate CMOS device 30 and method steps for manufacturing such a CMOS device in accordance with various embodiments of the invention. In this illustrative embodiment the only portion of CMOS device 30 that is illustrated includes a single PMOS transistor 32 and a single NMOS transistor 34. An integrated circuit formed from CMOS devices such as device 30 can include a large number of such transistors. In accordance with one exemplary embodiment of the invention, as described below, CMOS device 30 is fabricated by a three spacer process. Those of skill in the art will understand that the invention is not limited to a three spacer process and that the device could also be fabricated by processes that use more or fewer spacers and more or fewer associated source and drain implanted regions.

Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
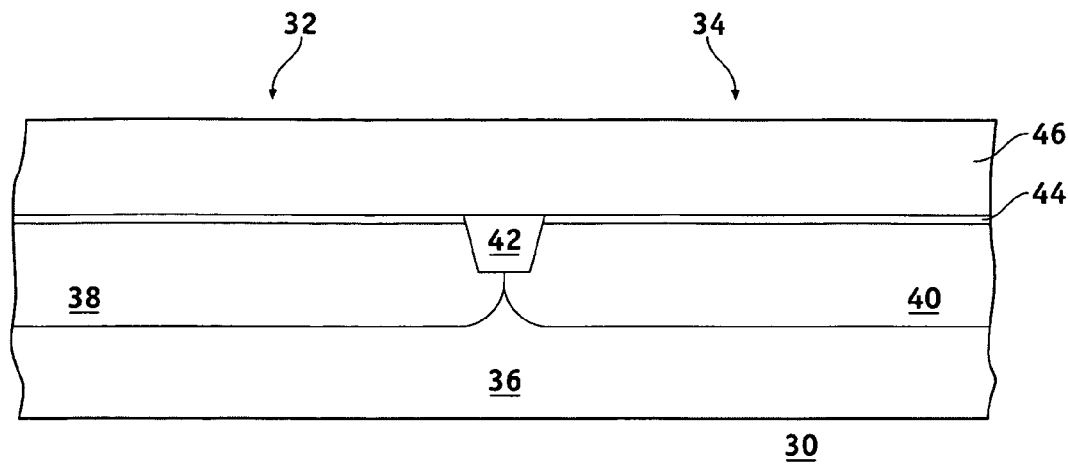

As illustrated in FIG. 1, the fabrication of a CMOS device 30 in accordance with an embodiment of the invention begins with providing a silicon substrate 36. The silicon substrate is preferably a monocrystalline silicon substrate wherein the term "silicon substrate" is used herein to encompass the generally monocrystalline and relatively pure silicon materials typically used in the semiconductor industry. Silicon substrate 36 may be a bulk silicon wafer or a thin layer of silicon on an insulating layer (commonly know as silicon-on-insulator or SOI) that, in turn, is supported by a silicon carrier wafer, but is here illustrated, without limitation, as a bulk silicon wafer. One portion 38 of the silicon wafer is doped with N-type impurity dopants (an N-well) and another portion 40 is doped with P-type impurity dopants (a P-well). The N-well and P-well can be doped to the appropriate conductivity, for example, by ion implantation. Shallow trench isolation (STI) 42 is formed to electrically isolate between the N-well and P-well and to isolate around individual devices that must be electrically isolated. Although not illustrated, the STI typically defines an active area for the formation of PMOS transistor 32 and a separate active area for the formation of N-channel transistor 34. The STI can also form the appropriate isolation (not illustrated) between the various PMOS and NMOS transistors that make up the completed CMOS integrated circuit. As is well known, there are many processes that can be used to form the STI, so the process need not be described here in detail. In general, STI includes a shallow trench that is etched into the surface of the silicon substrate and that is subsequently filled with an insulating material. After the trench is filled with the insulating material, the surface is usually planarized, for example by chemical mechanical planarization (CMP).

A layer of gate insulator 44 is formed on the surface of silicon substrate 36, including on the surface of N-well 38 and P-well 40 as illustrated in FIG. 1. The gate insulator may be a thermally grown silicon dioxide formed by heating the silicon substrate in an oxidizing ambient, or may be a deposited insulator such as a silicon oxide, silicon nitride, a high dielectric constant insulator such as HfSiO, or the like. Deposited insulators can be deposited by chemical vapor deposition (CVD), low pressure chemical vapor deposition (LPCVD), or plasma enhanced chemical vapor deposition (PECVD). In the illustrated embodiment the layer of gate insulator is a thermally grown silicon dioxide that grows at the surface of the silicon substrate. The gate insulator material is typically 1-10 nanometers (nm) in thickness. In accordance with one embodiment of the invention a layer of polycrystalline silicon 46 is deposited onto the layer of gate insulator and the STI. The layer of polycrystalline silicon is preferably deposited as undoped polycrystalline silicon and is subsequently impurity doped by ion implantation. Preferably the polycrystalline silicon has a thickness of about 100 nm.

Figure 2:
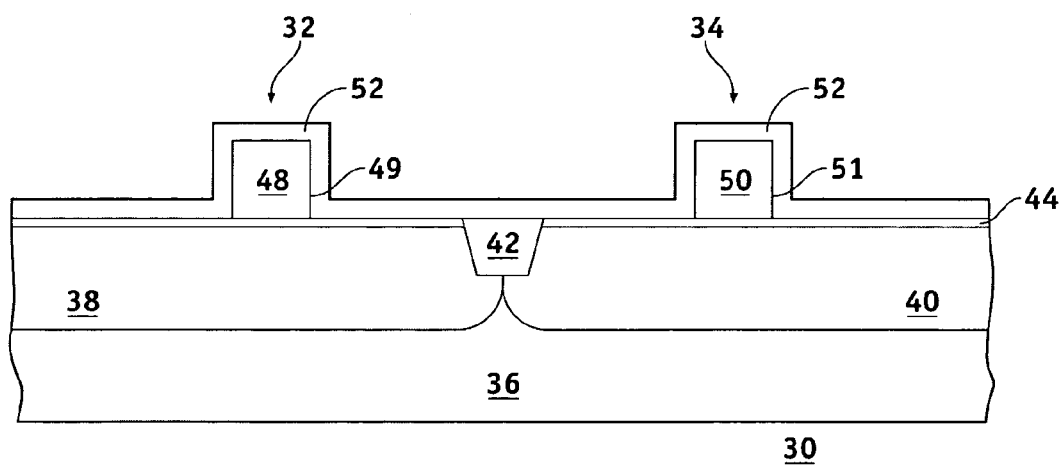

As illustrated in FIG. 2, the layer of polycrystalline silicon 46 is patterned to form a gate electrode 48 overlying N-well 38 and a gate electrode 50 overlying P-well 40. Gate electrodes 48 and 50 can be patterned using a conventional photolithographic patterning and plasma etch process. The plasma etch process terminates on gate insulating layer 44 which protects the surface of the substrate from etching or pitting during the patterning process. Gate electrode 48 has sidewalls 49 and gate electrode 50 has sidewalls 51. The gate electrodes are heated in an oxidizing ambient to form a thin thermal oxide (not illustrated) on the surface of the patterned polycrystalline silicon including on the sidewalls. The thermal oxide formed on the polycrystalline silicon gate electrodes serves to passivate the surfaces of the polycrystalline gates and can have a thickness, for example of about 2-5 nm. Thermal oxide also grows at the surface of silicon substrate 36, causing a slight thickening of the exposed portion of gate insulating layer 44. A layer of oxide 52 is deposited over the thin passivating thermal oxide. Layer 52 can be deposited, for example, by PECVD from a tetraethylorthosilicate (TEOS) source to a thickness of about 15-30 nm.

Figure 3:
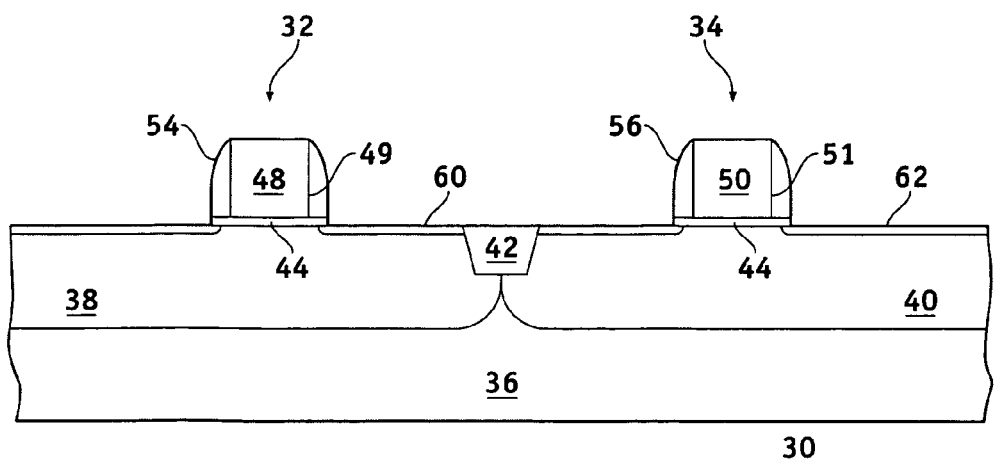

In accordance with this exemplary embodiment of the invention, deposited oxide 52 is anisotropically etched, for example by reactive ion etching (RIE) using a $CHF_3$, $CF_4$, or $SF_6$ etch chemistry, to form oxide sidewall spacers 54 on the sidewalls of gate electrode 48 and oxide sidewall spacers 56 on the sidewalls of gate electrode 50 as illustrated in FIG. 3. Oxide sidewall spacers 54 are then used as an ion implantation mask and P-type ions are implanted into the surface of N-well 38 in the silicon substrate to form P-type source and drain extensions 60 self aligned with oxide sidewall spacers 54 and gate electrode 48. In a similar manner oxide sidewall spacers 56 are used as an ion implantation mask and N-type ions are implanted into the surface of P-well 40 in the silicon substrate to form N-type source and drain extensions 62 self aligned with oxide sidewall spacers 56 and gate electrode 50. As is well known to those of skill in the art, a layer of photoresist can be patterned to mask P-well 40 during the P-type ion implantation and another layer of photoresist can be patterned to mask N-well 38 during the N-type ion implantation.

Figure 4:
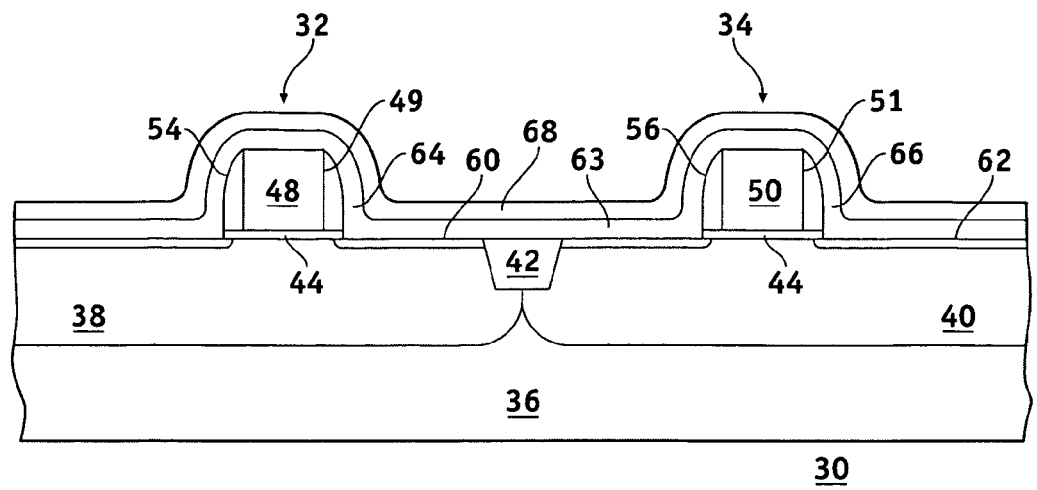

A layer of oxide 63 is deposited overlying the gate electrodes and sidewall spacers. The layer of oxide forms an oxide liner 64 on sidewall spacers 54 and an oxide liner 66 on sidewall spacers 56 as illustrated in FIG. 4. The layer of oxide can be deposited by PECVD from a TEOS source to a thickness of about 2-10 nm. A layer of silicon nitride 68 is deposited over the layer of oxide. The nitride can be deposited, for example, by LPCVD from the reaction of dichlorosilane and ammonia to a thickness of about 50 nm.

Figure 5:
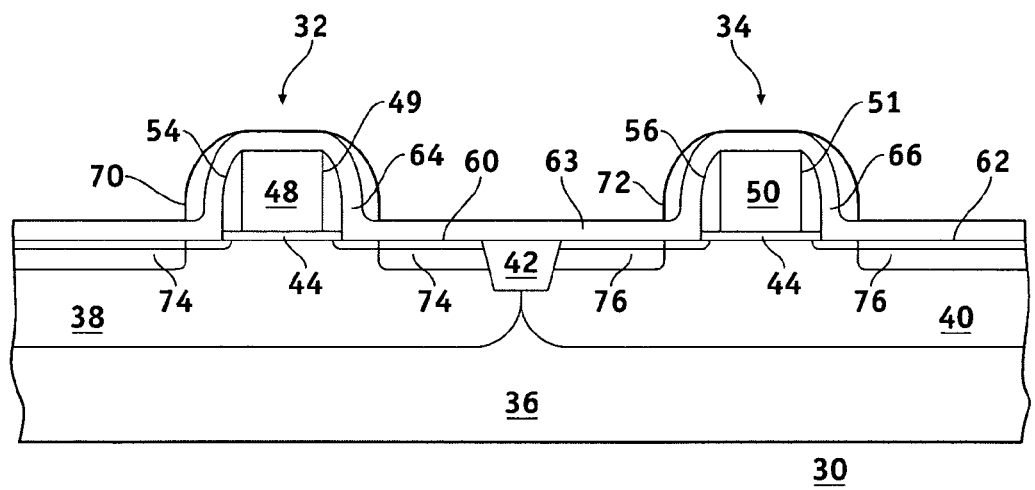

As illustrated in FIG. 5, silicon nitride layer 68 is anisotropically etched, for example, by RIE using a $CHF_3/O_2$ chemistry to form nitride sidewall spacers 70 overlying oxide liner 64 on sidewalls 49 of gate electrode 48 and nitride sidewall spacers 72 overlying oxide liner 66 on sidewalls 51 of gate electrode 50. The $CHF_3/O_2$ chemistry used to etch silicon nitride layer 68 is selective to nitride and leaves oxide liners 64 and 66 relatively unetched. As with the oxide sidewall spacers and the ion implantation of the source and drain extensions, nitride spacers 70 are used as an ion implantation mask and P-type ions are implanted into the surface of N-well 38 in the silicon substrate to form P-type source and drain buffer regions 74 self aligned with gate electrode 48. Nitride sidewall spacers 72 are used as an ion implantation mask and N-type ions are implanted into the surface of P-well 40 in the silicon substrate to form N-type source and drain buffer regions 76 self aligned with gate electrode 50. Again, a layer of photoresist can be patterned to mask P-well 40 during the P-type ion implantation and another layer of photoresist can be patterned to mask N-well 38 during the N-type ion implantation.

Figure 6:
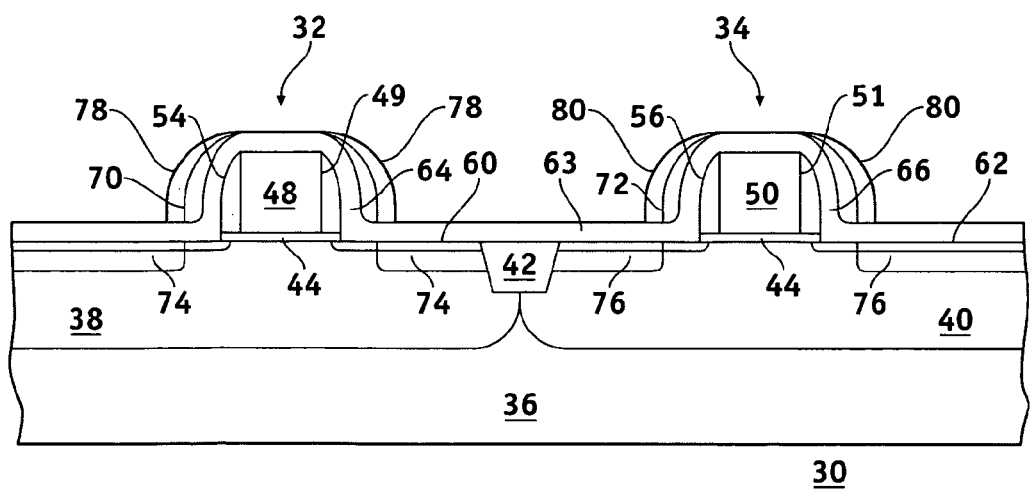

A further silicon nitride layer (not illustrated) is deposited over sidewall spacers 70 and 72 and the exposed portion of oxide layer 63. This further layer of silicon nitride can be deposited in the same manner as was silicon nitride layer 68. As illustrated in FIG. 6, the further silicon nitride layer is anisotropically etched, for example in the same manner as was silicon nitride layer 68, to form another silicon nitride sidewall spacer 78 overlying silicon nitride sidewall spacer 70 and another silicon nitride sidewall spacer 80 overlying silicon nitride sidewall spacer 72.

Figure 7:
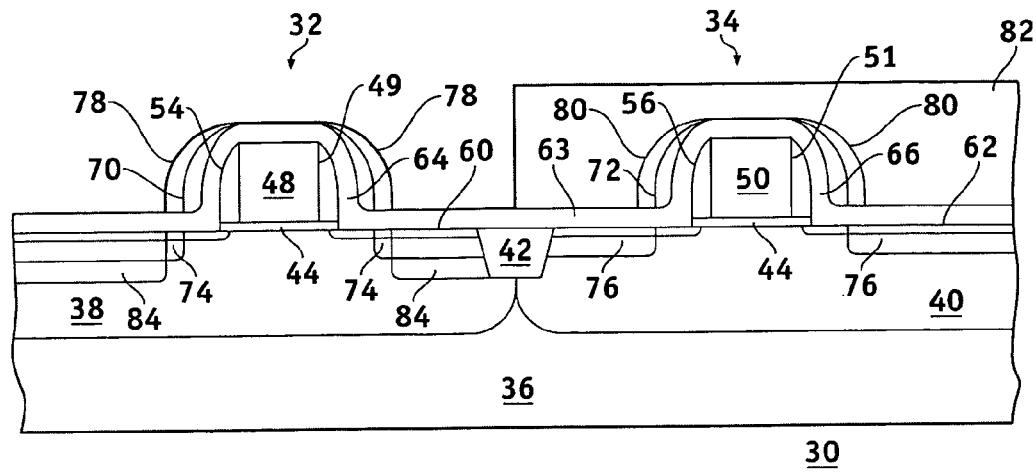

As illustrated in FIG. 7, a layer of photoresist 82 is applied and patterned to mask P-well 40. The patterned layer of photoresist is used together with additional nitride sidewall spacers 78 as an ion implantation mask, and P-type ions are implanted into the surface of N-well 38 to form deep P-type source and drain regions 84 self aligned with gate electrode 48.

Figure 8:
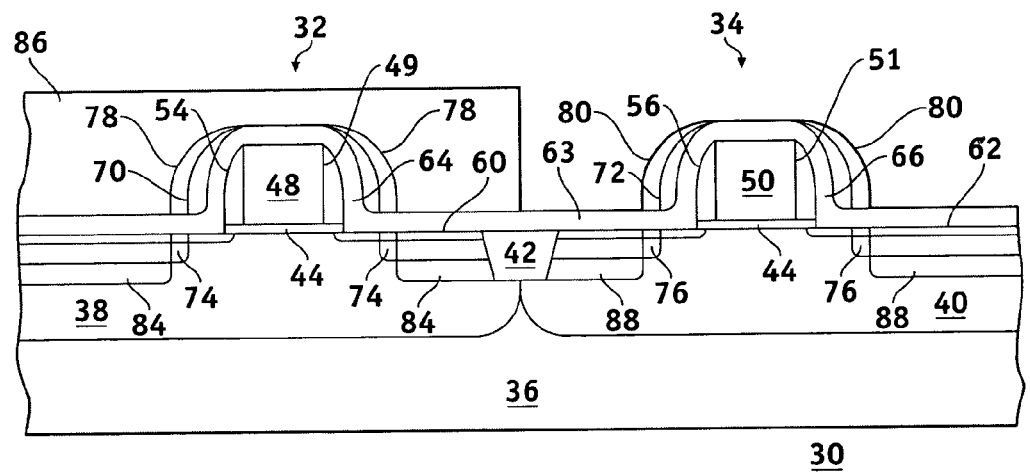

After removing photoresist layer 82, another layer of photoresist 86 is applied and patterned to mask N-well 38 as illustrated in FIG. 8. Patterned layer of photoresist 86 is used together with additional nitride sidewall spacers 80 as an ion implantation mask, and N-type ions are implanted into the surface of P-well 40 to form deep N-type source and drain regions 88 self aligned with gate electrode 50.

Figure 9:
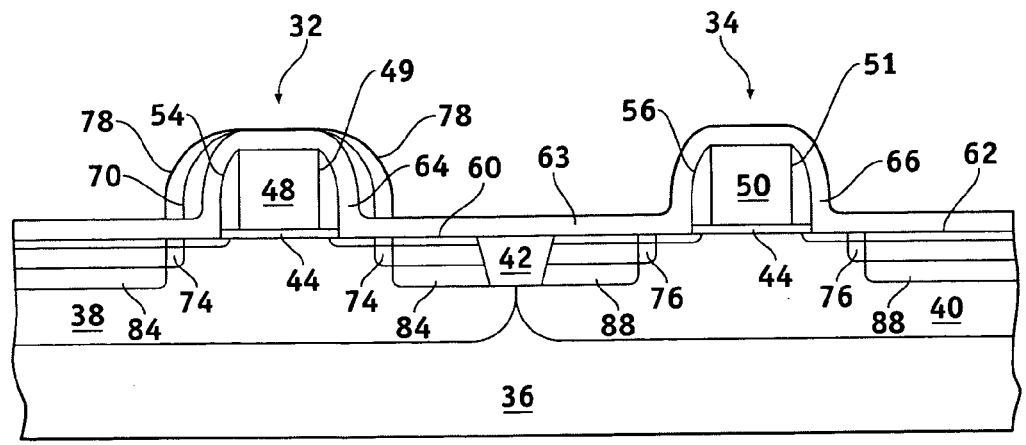

In accordance with a preferred embodiment of the invention, patterned layer of photoresist 86 is then used as an etch mask and nitride sidewall spacers 72 and 80 are removed, for example by anisotropic plasma etching using a $CHF_3$/$NF_3$/$O_2$/$N_2$ chemistry. After removing the patterned layer of photoresist, all of the ion implantations are activated by a thermal anneal such as a rapid thermal anneal (RTA). At this stage of processing CMOS device 30 appears as illustrated in FIG. 9 with nitride sidewall spacers 72 and 80 removed from NMOS transistor 34 and nitride sidewall spacers 70 and 78 still in place on the sidewalls of gate electrode 48 of PMOS transistor 32.

Figure 10:
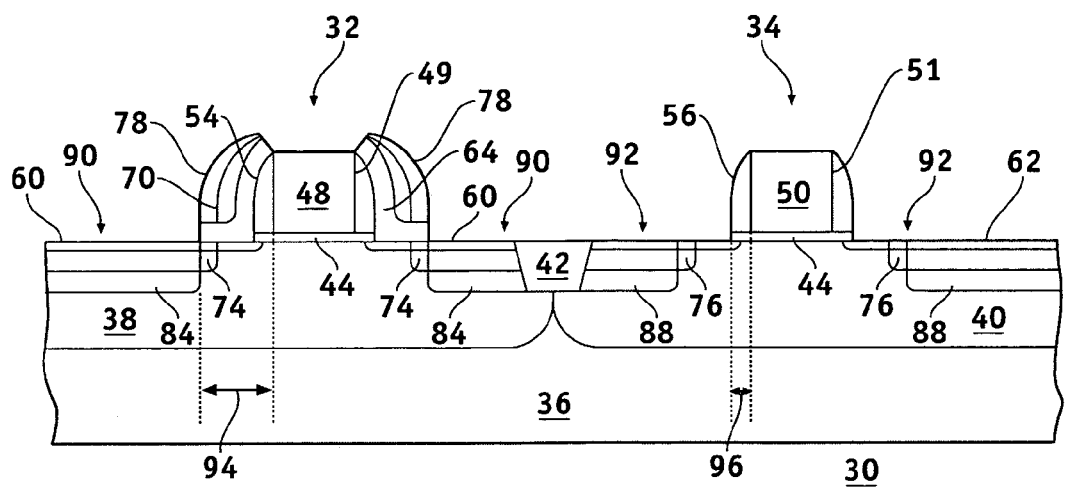

The method in accordance with an embodiment of the invention continues, as illustrated in FIG. 10 by etching oxide liner 66 and the exposed portion of oxide liner 64. In this etch step nitride sidewall spacers 70 and 78 act as an etch mask to protect a portion of oxide liner 64 on PMOS transistor gate electrode 48. The oxide liners can be etched by using a wet chemical etchant such as diluted hydrofluoric acid. The etch time is chosen to insure that at least a portion of oxide sidewall spacers 56 remains on sidewalls 51 of gate electrode 50. The etching of the oxide liners exposes a portion 90 of the surface of N-well 36 including the P-type source and drain implanted regions formed therein and a portion 92 of the surface of P-well 38 including the N-type source and drain implanted regions formed therein, as well as the top surface of gate electrodes 48 and 50. Portion 90 of the surface of N-well 40 is spaced apart from gate electrode 48 by a distance indicated by double headed arrow 94, and portion 92 of the surface of N-well 40 is spaced apart from gate electrode 50 by a distance indicated by double headed arrow 96. As illustrated, because of the masked etching of oxide liner 54, portion 90 is spaced apart from its associated gate electrode by a greater distance than portion 92 is spaced apart from its associated gate electrode.

Figure 11:
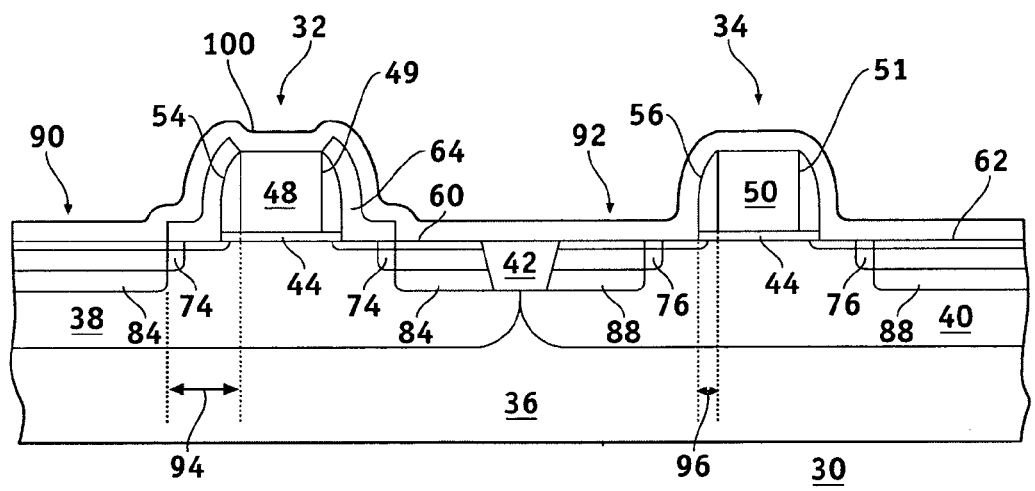

In accordance with one embodiment of the invention, after acting as an etch mask for the etching of the oxide liners, nitride spacers 70 and 78 are removed from PMOS transistor 32 by etching the nitride in, for example, hot phosphoric acid. A layer of silicide forming metal 100 is then blanket deposited on the surface of CMOS device 30 as illustrated in FIG. 11. The silicide forming metal can be, for example, cobalt, nickel, rhenium, ruthenium, or palladium, or alloys of those metals, and preferably is either cobalt or nickel. The silicide forming metal can be deposited, for example, by sputtering to a thickness of about 5-30 nm n.

Figure 12:
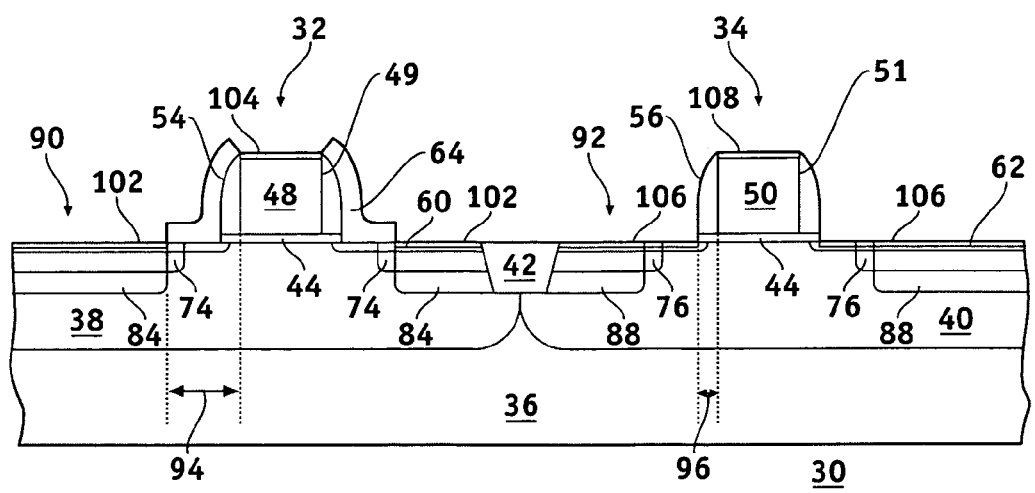

Following of deposition of metal layer 100, the layer is heated, for example by RTA, to react the metal with the underlying silicon to form a metal silicide layer 102 contacting the source and drain implanted regions of PMOS transistor 32, a metal silicide layer 104 contacting gate electrode 48 of PMOS transistor 32, a metal silicide layer 106 contacting the source and drain implanted regions of NMOS transistor 34, and a metal silicide layer 108 contacting gate electrode 50 of NMOS transistor 34 as illustrated in FIG. 12. Any silicide forming metal that is not in contact with exposed silicon, for example the silicide forming metal that is deposited on the sidewall spacers or on STI 42, does not react during the RTA to form a silicide and may subsequently be removed by wet etching in a $H_2O_2$/$H_2SO_4$ or $HNO_3$/HCl solution. Silicide layer 102 is spaced a greater distance from gate electrode 48 of the PMOS transistor than the distance silicide layer 106 is spaced from gate electrode 50. The silicide forming metals have a high thermal coefficient of expansion. Because of the high coefficient of thermal expansion, during the cooling that follows the heating to form the silicide, the metal silicide contracts faster than the silicon in which the silicide is formed. The differential contraction upon cooling generates a longitudinal tensile stress in the monocrystalline silicon outside the silicide area. Silicide layer 106 is formed near the edge of gate electrode 50 of NMOS transistor 34 and hence applies the longitudinal tensile stress to the channel of the NMOS transistor. This longitudinal tensile stress increases the mobility of the majority carrier electrons in the NMOS transistor. Silicide layer 102 is formed at a location spaced apart from gate electrode 48 of PMOS transistor 32 so that any tensile stress generated by silicide layer 102 is not applied to the channel of the PMOS transistor and the mobility of the majority carrier holes in the PMOS transistor remain relatively unaffected.

CMOS device 30 can be completed by well known steps (not illustrated) such as depositing a layer of dielectric material, etching opening through the dielectric material to expose portions of the silicide layers, and forming metallization that extends through the openings to electrically contact the source and drain regions. Further layers of interlayer dielectric material, additional layers of interconnect metallization, and the like may also be applied and patterned to achiever the proper circuit function of the integrated circuit being implemented.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof. For example, but without limitation, layer of silicide forming metal 100 can be deposited before nitride spacers 70 and 78 are removed from PMOS transistor 32. Those spacers can then be removed after the unreacted silicide forming metal is removed by wet etching.

What is claimed is:

1. A method for fabricating a CMOS device including a silicon substrate having a first region of N-type conductivity and a second region of P-type conductivity, the method comprising the steps of:

forming a first silicon gate electrode overlying the first region and a second silicon gate electrode overlying the second region, each of the first silicon gate electrode and the second silicon gate electrode having sidewalls;

depositing a silicon oxide layer overlying the first silicon gate electrode and the second silicon gate electrode to form a silicon oxide layer on the sidewalls;

forming a first oxide liner on the silicon oxide layer overlying the sidewalls of the first gate electrode and overlying a portion of the first region and a second oxide liner on the silicon oxide layer overlying the sidewalls of the second gate electrode and overlying a portion of the second region;

forming first nitride sidewall spacers on the first oxide liner and second nitride sidewall spacers on the second oxide liner;

removing the second nitride sidewall spacers;

etching the first oxide liner using the first nitride sidewall spacers as an etch mask to expose a portion of the first region, the exposed portion of the first region spaced a first distance from the sidewall of the first gate electrode;

etching the second oxide liner, after removing the second nitride sidewall spacers, to expose a portion of the second region, the exposed portion of the second region spaced a second distance from the sidewall of the second gate electrode, wherein the first distance is greater than the second distance; and forming a first silicide layer at the exposed portion of the first region and a second silicide layer at the exposed portion of the second region.

2. The method of claim 1 further comprising the step of removing the first nitride sidewall spacers after the step of etching the first oxide liner and before the steps of forming a first silicide layer and a second silicide layer.

3. The method of claim 1 wherein the steps of forming a first silicide layer and forming a second silicide layer comprise the steps of:
blanket depositing a layer of silicide forming metal; and
rapid thermal annealing the layer of silicide forming metal.

4. The method of claim 3 wherein the step of blanket depositing comprises the step of blanket depositing a metal from the group consisting of cobalt, nickel, rhenium, ruthenium, palladium, and alloys of those metals.

5. The method of claim 3 wherein the step of blanket depositing comprises the step of blanket depositing a metal from the group consisting of cobalt and nickel.

6. The method of claim 1 further comprising the step of anisotropically etching the silicon oxide layer to form a first oxide sidewall spacer on the first silicon gate electrode and a second oxide sidewall spacer on the second silicon gate electrode.

7. The method of claim 1 further comprising the steps of:
ion implanting P-type ions into the first region of N-type conductivity using the first nitride sidewall spacers as an ion implantation mask;
forming a layer of patterned photoresist masking the first region of N-type conductivity; and
ion implanting N-type ions into the second region of P-type conductivity using the second nitride sidewall spacers and the layer of patterned photoresist as an ion implantation mask.

8. The method of claim 7 wherein the step of removing the second nitride sidewall spacers comprises the step of etching the second nitride sidewall spacers using the layer of patterned photoresist as an etch mask.

9. A method for fabricating a CMOS device including a silicon substrate having a first N-type region and a second P-type region, the method comprising the steps of:

forming a first gate electrode overlying the first N-type region and a second gate electrode overlying the second P-type region;

forming a first oxide spacer, a first oxide liner, and a first nitride spacer on the first gate electrode;

forming a second oxide spacer, a second oxide liner, and a second nitride spacer on the second gate electrode;

ion implanting P-type source and drain regions in the first N-type region;

ion implanting N-type source and drain regions in the second P-type region;

removing the second oxide liner, after the steps of ion implanting to expose the N-type source and drain regions and removing an exposed portion of the first oxide liner to expose the P-type source and drain regions;

forming first silicide regions contacting the P-type source and drain regions in the first N-type region, the first silicide regions spaced apart from the first gate electrode by a first distance; and forming second silicide regions contacting the N-type source and drain regions in the second P-type region, the second silicide regions spaced apart from the second gate electrode by a second distance less than the first distance.

10. The method of claim 2 wherein the step of ion implanting P-type source and drain regions comprises the steps of:
ion implanting first P-type source and drain regions using the first oxide spacer as an ion implantation mask; and
ion implanting second P-type source and drain regions using the first nitride spacer as an ion implantation mask.

11. The method of claim 9 wherein the step of ion implanting N-type source and drain regions comprises the steps of:
ion implanting first N-type source and drain regions using the second oxide spacer as an ion implantation mask;
forming a patterned photoresist layer overlying the first N-type region; and
ion implanting second N-type source and drain regions using the patterned photoresist layer and the second nitride spacer as an ion implantation mask.

12. The method of claim 11 further comprising the step of removing the second nitride spacers after the step of ion implanting second N-type source and drain regions using the patterned photoresist layer as an etch mask.

13. The method of claim 12 further comprising the step of etching the first nitride spacer after the step of removing the exposed portion of the first oxide liner.

14. The method of claim 9 wherein the steps of forming first silicide regions and forming second silicide regions comprises the steps of forming first silicide regions and forming second silicide regions each comprising a metal silicide selected from the group consisting of nickel silicide and cobalt silicide.

15. A method for fabricating a CMOS device including a silicon substrate having a first region of N-type conductivity and a second region of P-type conductivity, the method comprising the steps of:

forming a first silicon gate electrode overlying the first region and a second silicon gate electrode overlying the second region, each of the first silicon gate electrode and the second silicon gate electrode having sidewalls;

forming a first oxide sidewall spacer on the sidewalls of the first gate electrode and a second oxide spacer on the sidewalls of the second gate electrode;

ion implanting first P-type conductivity determining ions into the first region of N-type conductivity using the first oxide sidewall spacer as an ion implantation mask;

ion implanting first N-type conductivity determining ions into the second region of P-type conductivity using the second oxide sidewall spacer as an ion implantation mask;

depositing a first oxide liner overlying the first oxide sidewall spacer and the first region of N-type conductivity;

depositing a second oxide liner overlying the second oxide sidewall spacer and the second region of P-type conductivity;

forming a first nitride sidewall spacer overlying the first oxide liner and a second nitride sidewall spacer overlying the second oxide liner;

ion implanting second P-type conductivity determining ions into the first region of N-type conductivity using the first nitride sidewall spacer as an ion implantation mask;

forming a patterned photoresist layer overlying the first region and having an opening therethrough exposing the second region;

ion implanting second N-type conductivity determining ions into the second region of P-type conductivity using the second nitride sidewall spacer and the patterned photoresist layer as an ion implantation mask;

removing the second nitride sidewall spacer using the patterned photoresist layer as an etch mask;

removing a portion of the first oxide liner using the first nitride spacer as an etch mask to expose a first portion of the first region, the first portion spaced apart from the first gate electrode by a first distance;

removing the second oxide liner, after removing the second nitride sidewall spacer, to expose a second portion of the second region, the second portion spaced apart from the second gate electrode by a second distance less than the first distance; and forming a first silicide region in the first exposed portion and a second silicide region in the second exposed portion.

16. The method of claim 15 wherein the steps of forming a first silicide region and forming a second silicide region comprise the steps of:

depositing a layer of a metal selected from the group consisting of cobalt, nickel, rhenium, ruthenium, palladium, and alloys of those metals; and heating the layer of metal to react the layer of metal with the first exposed portion and the second exposed portion.

* * * * *

UNITED STATES PATENT AND TRADEMARK OFFICE
CERTIFICATE OF CORRECTION

PATENT NO. : 7,348,233 B1
APPLICATION NO. : 11/207265
DATED : March 25, 2008
INVENTOR(S) : Martin Gerhardt et al.

It is certified that error appears in the above-identified patent and that said Letters Patent is hereby corrected as shown below:

In Column 8, line 26, delete "claim 2" and add -- claim 9 --.

Signed and Sealed this

First Day of July, 2008

JON W. DUDAS
*Director of the United States Patent and Trademark Office*